(12) United States Patent
Park

(10) Patent No.: US 8,853,730 B2
(45) Date of Patent: Oct. 7, 2014

(54) LIGHT EMITTING DEVICE AND MANUFACTURING METHOD THEREOF

(75) Inventor: Bo Geun Park, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 1540 days.

(21) Appl. No.: 11/849,097

(22) Filed: Aug. 31, 2007

(65) Prior Publication Data

US 2008/0054285 A1 Mar. 6, 2008

(30) Foreign Application Priority Data

Sep. 4, 2006 (KR) .................. 10-2006-0084901

(51) Int. Cl.
*H01L 33/00* (2010.01)
*H01L 33/54* (2010.01)

(52) U.S. Cl.
CPC ...................................... *H01L 33/54* (2013.01)
USPC .............. 257/99; 257/98; 257/667; 257/668; 257/E21.002; 257/E33.059; 257/E33.061; 438/27; 174/523

(58) Field of Classification Search
CPC ......... H01L 33/56; H01L 33/54; H01L 33/52; H01L 33/60; H01L 33/502; H01L 33/486; H01L 2924/12041; H01L 33/44; H01L 33/504; H01L 2933/0041; H01L 31/0203; H01L 31/0232; H01L 33/382; H01L 21/565; H01L 23/49861; H01L 33/385; H01L 33/50; H01L 51/5237; H01L 51/5275

USPC .................. 257/98, 99, 667, 668, E21.002, 257/E33.059, E33.061; 438/27; 174/523
See application file for complete search history.

(56) References Cited

U.S. PATENT DOCUMENTS

| 2002/0145152 A1* | 10/2002 | Shimomura ................ 257/98 |
| 2005/0218421 A1* | 10/2005 | Andrews et al. ............. 257/100 |
| 2006/0063287 A1* | 3/2006 | Andrews .................... 438/22 |
| 2007/0102722 A1* | 5/2007 | Ishizaka et al. .............. 257/99 |
| 2008/0023711 A1* | 1/2008 | Tarsa et al. .................. 257/98 |

FOREIGN PATENT DOCUMENTS

KR 10-2006-0036937 A 5/2006
WO WO 2006006544 A1 * 1/2006

* cited by examiner

*Primary Examiner* — Meiya Li
(74) *Attorney, Agent, or Firm* — Birch, Stewart, Kolasch & Birch, LLP

(57) ABSTRACT

A light emitting device comprises a substrate including a top surface that is flat, a light emitting diode on the substrate, a lead frame formed on the flat top surface of the substrate. The lead frame includes a circuit with a predetermined pattern to electrically connect to the light emitting diode. A dam part is formed on the substrate and is adjacent to the light emitting diode. A first member is formed on the light emitting diode, the first member including a fluorescent substance to convert a light emission spectrum of light from the light emitting diode. A second member is surrounded by the dam part and is formed on the substrate adjacent to the first member, and a lens covers the first member, the second member and the light emitting diode.

22 Claims, 4 Drawing Sheets

LIGHT EMITTING DEVICE AND MANUFACTURING METHOD THEREOF

CROSS-REFERENCE TO RELATED APPLICATIONS

The present application claims priority under 35 U.S.C. 119 and 35 U.S.C. 365 to Korean Patent Application No. 10-2006-0084901 (filed on Sep. 4, 2006), which is hereby incorporated by reference in its entirety.

BACKGROUND

Embodiments relates to a light emitting device and manufacturing method thereof.

LEDs (Light Emitting Diodes) constitute a light emission source by using GaAs, AlGaAs, GaN, InGaN or InGaAlP-based compound semiconductor materials, thereby producing various colors.

Such LEDs have been packetized and used as light emission devices. Further, the LEDs have been used as light sources in various fields such as a lightening indicator, a character indicator and an image indicator.

SUMMARY

The embodiment provides a light emitting device, in which an LED (light emitting diode) is sealed by a molding member having a double sealing structure, and a manufacturing method thereof.

The embodiment provides a light emitting device, in which a lens adheres before a molding member having a double sealing structure is cured and thus the lens can be adhered with stability, and a manufacturing method thereof.

The embodiment provides a light emitting device comprising: a substrate; a light emitting diode on the substrate; a molding member sealing the light emitting diode in a double sealing structure and comprising a flat upper surface.

The embodiment provides a light emitting device comprising: a substrate; a light emitting diode on the substrate; a first molding member sealing the light emitting diode; a second molding member on the first molding member; and a lens adhering on the second molding member.

The embodiment provides a method for manufacturing a light emitting device, the method comprising the steps of: mounting a light emitting diode on a substrate; sealing the light emitting diode by using a molding member comprising a double sealing structure; and adhering a lens onto the molding member and curing the molding member.

DETAILED DESCRIPTION OF THE EMBODIMENTS

Hereinafter, a light emitting device according to an embodiment will be described in detail with reference to the accompanying drawings.

Figure 1:
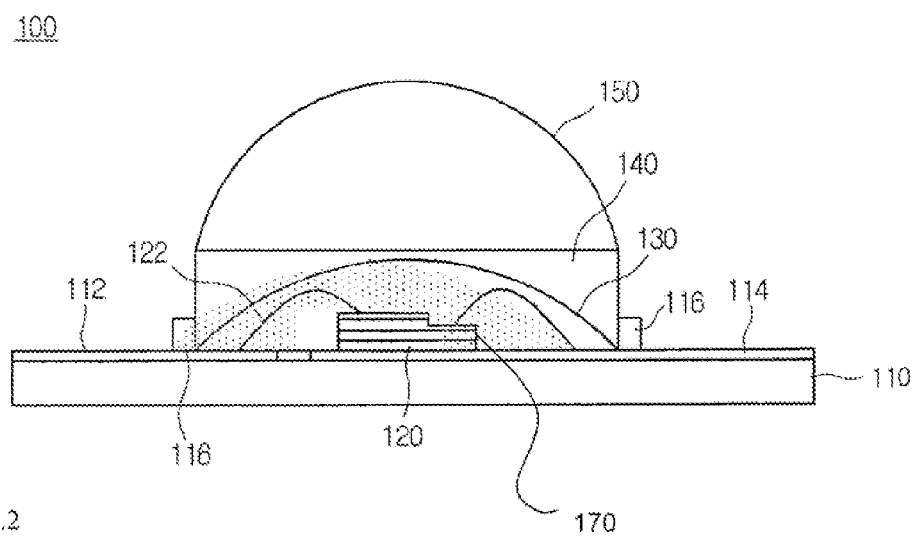
FIG. 1 is a side sectional view showing a light emitting device according to a first embodiment.

FIG. 1 is a side sectional view showing a light emitting device according to a first embodiment.

Referring to FIG. 1, the light emitting device 100 comprises a substrate 110, a LED 120, a first molding member 130, a second molding member 140 and a lens 150.

The substrate 110 comprises a material such as a MCPCB (Metal Core Printed Circuit Board), a FR-4, and a CEM (Composite Epoxy materials grade) PCB. Further, the substrate 110 may also be formed in the form of a COB (chip on board).

Multiple lead frames 112 and 114 are formed on the substrate 110. The lead frames 112 and 114 are electrically opened to each other and electrically connected to the LED 120. Reflective material such as Ag and Al can also be coated on or attached to the surfaces of the lead frames 112 and 114.

The LED 120 is fixed to any one of the lead frames 112 and 114, and is connected to each lead frame 112 and 114 through a wire 122. The LED 120 can be connected the lead frames 112 and 114 through one wire or in a flip manner. However, the embodiment is not limited thereto.

The LED 120 can be realized selectively using GaAs, AlGaAs, GaN, InGaN and/or InGaAlP-based compound semiconductor materials. Further, the LED 120 can comprise at least one of red, green and blue LED chips.

A dam part 116 is formed on the substrate 110. The dam part 116 can be formed on the substrate 110 in the form of a dam or a bank having a circular configuration or a polygonal loop configuration by using a non-conductive material such as resin.

The molding members 130 and 140 seal the LED 120 in a double sealing structure. Such molding members 130 and 140 are formed in the form of a circular column or a polygonal column in the inner side of the dam part 116.

The first molding member 130 is formed on and around the LED 120 and the second molding member 140 is formed on the first molding member 130. The first and second molding members 130 and 140 can comprise resin such as epoxy or silicon or material similar to the resin.

The first molding member 130 is formed in the form of a convex lens. The second molding member 140 is formed on the first molding member 130 in the form of a circular column or a polygonal column, and has a flat upper surface.

The first molding member 130 seals the LED 120, the wire 122 and a bonding region. The wire 122 may also be sealed in the first molding member 130 or the second molding member 140.

A fluorescent substance can be added to at least one of the first and second molding members 130 and 140. For instance, a fluorescent substance 170 can be added to the first molding member 130. For example, a yellow fluorescent substance that emits a yellow light by converting a part of a blue light of a blue LED chip into the yellow light may also be added.

First and second fluorescent substances may be added to the first molding member 130 and/or the second molding member 140, respectively. The first and second fluorescent substances may be fluorescent substances having similar light emitting spectrums, i.e. yellow fluorescent substances. Further, the first and second fluorescent substances may be fluorescent substances having different light emission spectrums, i.e. a red fluorescent substance and a green fluorescent substance. Such fluorescent substances may comprise red, yellow, green and blue fluorescent substances. The embodiment is not limited thereto.

The first molding member 130 can be formed using liquid resin of about 0.01 g, and the second molding member 140 can be formed using liquid resin of about 0.02 g to 0.04 g.

That is, the second molding member 140 has a volume larger than that of the first molding member 130.

The second molding member 140 may comprise material identical to that of the lens 150, or material such as resin (e.g. epoxy, silicon and phenyl) having optical (refractive index), physical and chemical characteristics similar to the lens 150.

The lens 150 adheres onto the second molding member 140. The lens 150 has hemispherical shape and integrally adheres to the flat upper surface of the second molding member 140. Such a lens 150 is integrally adhered to the second molding member 140 without using an additional adhesion member when the second molding member 140 is cured. The lens 150 may also comprise a hemispherical convex shape or a lens having a concave-convex shape formed thereon. The embodiment is not limited thereto.

As described above, the optical characteristics of the lens 150 may not be degraded by considering the physical and optical characteristics of the second molding member 140 and the lens 150. Further, the lens 150 can be firmly adhered to the second molding member 140.

FIGS. 2 to 5 are sectional views showing the procedure for manufacturing the light emitting device according to the first embodiment.

Figure 2:
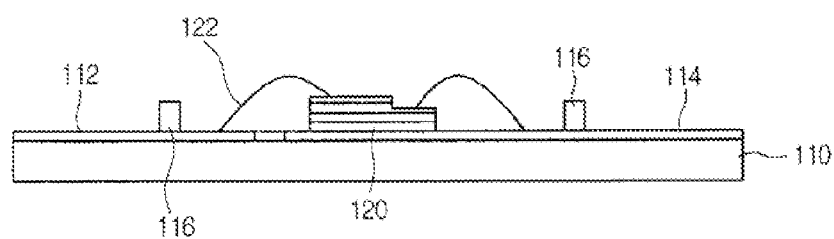
FIGS. 2 to 5 are sectional views showing the procedure for manufacturing a light emitting device according to a first embodiment.

Referring to FIG. 2, the LED 120 is fixed to the lead frame 114 on the substrate 110 and is connected to the lead frames 112 and 114 through the wire 122.

The dam part 116 is formed on the lead frame 114 and around the LED 120. The dam part 116 is formed on the substrate 110 in the form of a dam or a bank having a circular configuration or a polygonal loop configuration by using non-conductive material such as resin.

Figure 3:
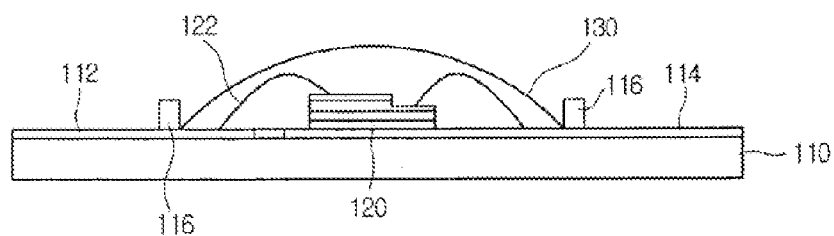

Referring to FIG. 3, the first molding member 130 is dispensed on and around the LED 120. At this time, the first molding member 130 has a convex lens shape in the inner side of the dam part 116.

A predetermined amount (e.g. 0.01 g) of the first molding member 130 comprising liquid resin such as epoxy or silicon is dispensed, thereby sealing the LED 120 and the peripheral area of the LED 120. The first molding member 130 is cured using a thermosetting method. At this time, the thermosetting temperature is resin curing temperature. For example, the first molding member 130 is heated at the temperature of about 150° C.

The first dispensed molding member 130 is formed in the inner side of the dam part 116 to seal the LED 120, the wire 122 and the wire bonding region.

Figure 4:
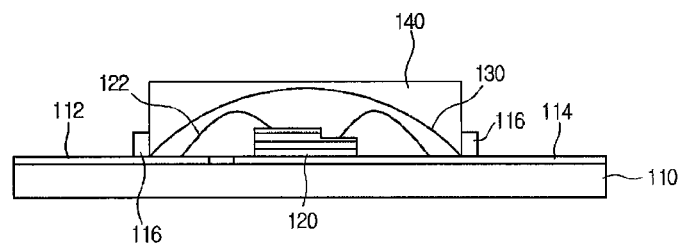

Referring to FIG. 4, the second molding member 140 is molded on the first molding member 130. The second molding member 140 is molded after the first molding member 130 is cured, so that bubbles can be prevented from being formed between the first molding member 130 and the second molding member 140.

The second molding member 140 is molded on the first molding member 130 by using a predetermined amount (e.g. 0.02 g to 0.04 g) of liquid resin. The second molding member 140 may comprise material the same as that of the first molding member 130, e.g. resin such as epoxy or silicon.

The second molding member 140 is formed in the inner side of the dam part 160, is formed in the form of a circular column or a polygonal column, and has a flat upper surface. Such first and second molding members 130 and 140 can selectively use a dispensing molding method using a syringe, an insert molding method or a transfer molding method.

Further, a fluorescent substance (not shown) may be added to at least one of the first and second molding members 130 and 140. For example, at least one of yellow, red, blue and green fluorescent substances may be added to the first molding member 130 or/and the second molding member 140. The embodiment is not limited thereto.

Figure 5:
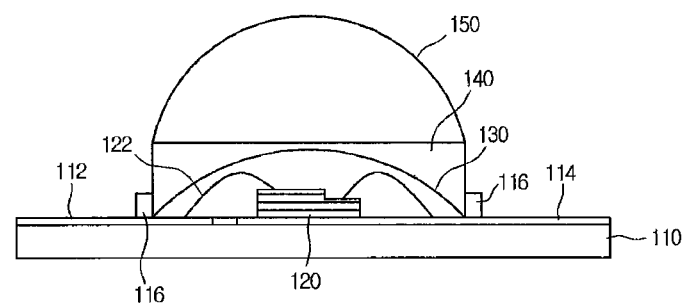

Referring to FIG. 5, the lens 150 having a hemispherical shape is adhered onto the second molding member 140. The lens 150 is integrally adhered onto the second molding member 140. To this end, the lens 150 is safely seated to the flat upper surface of the second molding member 140 before the second molding member 140 is cured, and then the second molding member 140 is cured. The curing temperature of the second molding member 140 is resin curing temperature, e.g. about 150° C.

Then, the lens 150 is integrally fixed on the second molding member 140, thereby completing fabrication of the light emitting diode package. Further, the lens 150 is adhered on the second molding member 140 with structural stability, so that that the lens 150 can be firmly attached to the second molding member 140 and the optical characteristics of the lens 150 may not be degraded when the lens 150 is used.

The upper surface of the second molding member 140 and the bottom surface of the lens 150 may have the same area or different areas. For example, the upper surface of the second molding member 140 may have a diameter larger than that of the bottom surface of the lens 150. Further, the second molding member 140 may use material having optical, physical and chemical characteristics the same as or similar to those of the lens 150.

Figure 6:
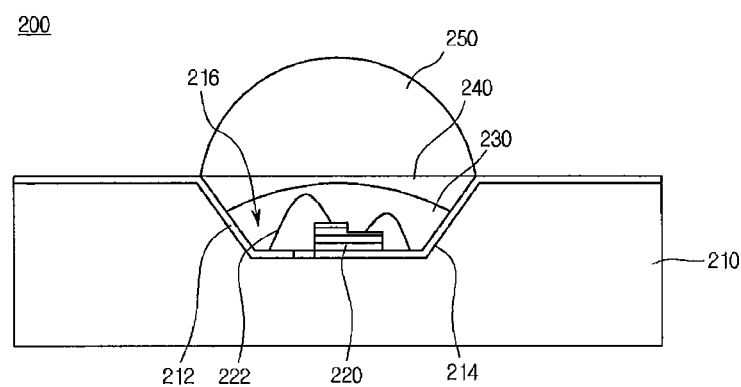
FIG. 6 is a side sectional view showing a light emitting device according to a second embodiment.

FIG. 6 is a side sectional view showing a light emitting device according to a second embodiment.

Referring to FIG. 6, the light emitting device 200 comprises a substrate 210 having a groove 216, a plurality of lead frames 212 and 214, a LED 220, a first molding member 230, a second molding member 240 and a lens 250.

The groove 216 formed on the substrate 210 may have a circular shape or a polygonal shape and can be formed through injection molding. However, the embodiment is not limited thereto.

The lead frames 212 and 214 are electrically opened in the groove 216, and the LED 220 is mounted on the lead frames 212 and 214 in the groove 216. The lead frames 212 and 214 are slantingly formed along the inner peripheral surface of the groove 216, and reflective material, e.g. Ag or Al, may also be coated on the surfaces of the lead frames 212 and 214.

The first molding member 230 is dispensed on the groove 216 and then cured. Then, the second molding member 240 is dispensed on the first molding member 230. The upper surface of the second molding member 240 is flat, and the flat upper surface is formed on the same plane with the upper surface of the substrate 210. As described above, the second molding member 240 is formed after the first molding member 230 is cured, so that bubbles can be prevented being formed between the first molding member 230 and the second molding member 240.

The first molding member 230 and the second molding member 240 comprise liquid resin such as epoxy or silicon, and are cured using a thermosetting method at the temperature of about 150° C. The second molding member 240 may have amount equal to or greater than that of the first molding member 230. For example, the amount of the second molding member 240 is at least twice the amount of the first molding member 230.

The first and second molding members 230 and 240 can be molded using a dispensing molding method using a syringe, an insert molding method or a transfer molding method.

Further, a fluorescent substance (not shown) may be added to at least one of the first and second molding members 230 and 240. For example, at least one of yellow, red, blue and green fluorescent substances may be added to the first molding member 230 or/and the second molding member 240. The embodiment is not limited thereto.

The lens 250 adheres onto the second molding member 240. The lens 250 has a hemispherical convex shape and adheres onto the upper surface of the second molding member 240. In detail, the lens 250 adheres onto the upper surface of the second molding member 240 during the curing process of the second molding member 240.

As described above, the molding members 230 and 240 are molded on the LED 220 in a double sealing structure, and then the lens 250 integrally adheres onto the upper surface of the second molding member 240, thereby completing fabrication of the light emitting diode package.

Figure 7:
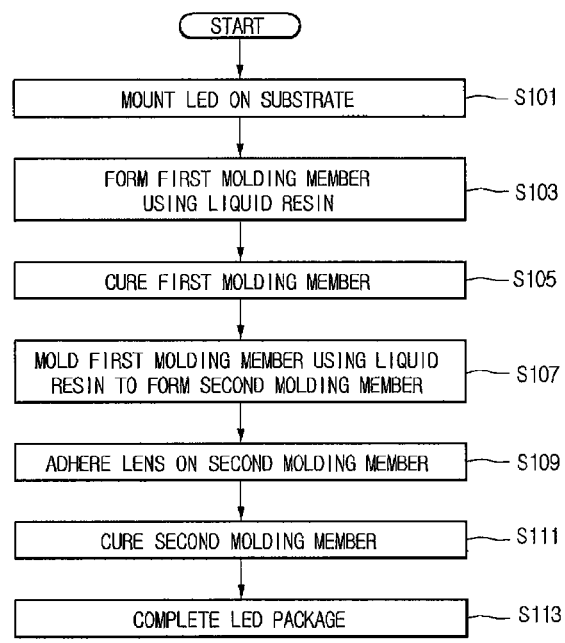
FIG. 7 is a flow diagram showing the procedure for manufacturing a light emitting device according to an embodiment.

FIG. 7 is a flow diagram showing the procedure for manufacturing the light emitting device according to the embodiment.

Referring to FIG. 7, the LED is mounted on the lead frame on the substrate (S101). The substrate may have a flat structure or a groove shape.

Liquid resin is primarily molded on and around the LED to form the first molding member (S103). Such a first molding member uses liquid resin such as epoxy or silicon and is cured at a predetermined temperature (S105).

Liquid resin is secondarily molded on the first molding member to form a second molding member (S107).

At this time, a hemispherical convex lens is adhered onto the flat upper surface of the second molding member before the second molding member is cured (S109). Then, the second molding member is cured at a predetermined temperature (S111), thereby completing fabrication of the LED package (S113).

The second molding member can comprise resin the same as or different from that of the first molding member. Further, since the second molding member can use material having the physical and chemical characteristics the same as or similar to those of the lens, the optical characteristics of the lens may not be degraded when the lens is used. Furthermore, the lens can be fixed with structural stability.

It will be understood that when an element is referred to as being 'on' or "under" another element, it can be directly on/under the element, and one or more intervening elements may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate including an entire top surface that is flat;
a light emitting diode on the substrate;
a lead frame formed on the flat top surface of the substrate, the lead frame electrically connected to the light emitting diode;
a dam part formed on the substrate and being adjacent to the light emitting diode;
a first member formed on the light emitting diode, the first member including a fluorescent substance to convert a light emission spectrum of light from the light emitting diode;
a second member being surrounded by the dam part and formed on the substrate adjacent to the first member; and
a lens covering the first member, the second member and the light emitting diode,
wherein a distance from an uppermost surface of the dam part to a top surface of the substrate is less than a distance from an uppermost surface of the first member to the top surface of the substrate,
the dam part is in a circle shape and has an opening,
at least a portion of the dam part has a vertical inner surface that contacts the second member,
a width of the substrate is greater than a width of the dam part so that the substrate extends beyond the dam part,
the lead frame includes a portion that is disposed on the substrate and extending beyond the darn part, and
an outer side of the lens does not extend beyond the dam part.

2. The light emitting device as claimed in claim 1, wherein at least one of the first member and the second member comprises epoxy or silicone.

3. The light emitting device as claimed in claim 1, wherein the lens comprises a hemispherical convex shape.

4. The light emitting device as claimed in claim 1, wherein the second member has a substantially flat top surface.

5. A light emitting device comprising:
a substrate including an entire top surface that is flat;
a light emitting diode on the substrate;
a lead frame formed on the flat top surface of the substrate, the lead frame electrically connected to the light emitting diode;
a dam part formed on the substrate and being adjacent to the light emitting diode;
a first member formed on the light emitting diode, the first member including a fluorescent substance to convert a light emission spectrum of light from the light emitting diode;
a second member being surrounded by the dam part and formed above the first member and the light emitting diode; and
a lens covering the first member, the second member and the light emitting diode,
wherein the dam part is in a circle shape and has an opening,
at least a portion of the dam part has a vertical inner surface that contacts the second member,
a width of the substrate is greater than a width of the dam part so that the substrate extends beyond the dam part,
the lead frame includes a portion that is disposed on the substrate and extending beyond the dam part,
an outer side of the lens does not extend beyond the dam part,
the outer side of the lens is aligned with the vertical inner surface of the at least one portion of the dam part, and both a bottom surface of the dam art and a bottom surface of the second member are substantially at the same horizontal plane.

6. The light emitting device as claimed in claim 5, wherein the lens adheres to a top surface of the second member.

7. The light emitting device as claimed in claim 6, wherein the lead frame is interposed between the substrate and the dam part such that both the substrate and the dam part are separate from each other.

8. The light emitting device as claimed in claim 6, wherein the second member comprises a material substantially identical to a material of the lens so as to have an optical characteristic similar to the lens.

9. The light emitting device as claimed in claim 6, the top surface of the second member and a bottom surface of the lens have a substantially same area.

10. The light emitting device as claimed in claim 5, wherein the lens comprises a hemispherical convex shape.

11. The light emitting device as claimed in claim 5, wherein the second member has a substantially flat top surface.

12. The light emitting device as claimed in claim 11, wherein the lead frame is interposed between the substrate and the darn part such that both the substrate and the dam part are separate from each other.

13. The light emitting device as claimed in claim 11, wherein the second member comprises a material substantially identical to a material of the lens so as to have an optical characteristic similar to the lens.

14. The light emitting device as claimed in claim 11, wherein the substantially flat top surface of the second member and a bottom surface of the lens have a substantially same area.

15. The light emitting device as claimed in claim 5, wherein the lead frame is interposed between the substrate and the dam part such that both the substrate and the dam part are separate from each other.

16. The light emitting device as claimed in claim 5, wherein the second member comprises a material substantially identical to a material of the lens so as to have an optical characteristic similar to the lens.

17. The light emitting device as claimed in claim 5, wherein an upper surface of the second member and a bottom surface of the lens have a substantially same area.

18. The light emitting device as claimed in claim 5, wherein the first member is formed in the form of a convex lens to cover the light emitting diode.

19. The light emitting device as claimed in claim 5, wherein the bottom surface of the second member and a bottom surface of the light emitting diode are substantially disposed at the same horizontal plane.

20. The light emitting device as claimed in claim 5, wherein a width of the second member and a width of the lens are substantially the same.

21. The light emitting device as claimed in claim 5, wherein a width of the opening and a width of the second member are substantially the same.

22. The light emitting device as claimed in claim 5, wherein the bottom surface of the second member is disposed lower than a top surface of the light emitting diode.

* * * * *